US007795608B2

(12) United States Patent
Hirohata et al.

(10) Patent No.: US 7,795,608 B2
(45) Date of Patent: Sep. 14, 2010

(54) PHOTOCATHODE

(75) Inventors: Toru Hirohata, Hamamatsu (JP); Minoru Niigaki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/177,914

(22) Filed: Jul. 23, 2008

(65) Prior Publication Data

US 2009/0032797 A1 Feb. 5, 2009

(30) Foreign Application Priority Data

Jul. 30, 2007 (JP) ........................... P2007-197892

(51) Int. Cl.
*H01L 29/12* (2006.01)

(52) U.S. Cl. ................... 257/10; 257/11; 257/E27.012; 257/E27.016; 313/530; 313/542

(58) Field of Classification Search ................... 257/10, 257/11, E27.012, E27.016; 313/527, 530, 313/541, 542; 438/20
See application file for complete search history.

(56) References Cited

U.S. PATENT DOCUMENTS 5,471,051 A * 11/1995 Niigaki et al. ........ 250/214 VT
6,563,264 B2 * 5/2003 Niigaki et al. .............. 313/527

FOREIGN PATENT DOCUMENTS

JP 2668285 7/1997

OTHER PUBLICATIONS http://en.wikipedia.org/wiki/Infrared.*

* cited by examiner

*Primary Examiner*—Evan Pert
*Assistant Examiner*—Scott R Wilson
(74) *Attorney, Agent, or Firm*—Drinker Biddle & Reath LLP

(57) ABSTRACT

When to-be-detected light is made incident from a support substrate 2 side of a photocathode E1, a light absorbing layer 3 absorbs this to-be-detected light and produces photoelectrons. However, depending on the thickness and the like of the light absorbing layer 3, the to-be-detected light can be transmitted through the light absorbing layer 3 without being sufficiently absorbed by the light absorbing layer 3. The to-be-detected light transmitted through the light absorbing layer 3 reaches an electron emitting layer 4. A part of the to-be-detected light that has reached the electron emitting layer 4 proceeds toward a through-hole 5*a* of a contact layer 5. Since the length d1 of a diagonal line of the through-hole 5*a* is shorter than the wavelength of the to-be-detected light, the to-be-detected light can be suppressed from passing through the through-hole 5*a* and being emitted to the exterior. The to-be-detected light suppressed from being externally emitted is reflected on the exposed surface of the electron emitting layer 4 and is again made incident into the light absorbing layer 3 to be absorbed. Thereby, a photocathode excellent in light detection sensitivity is realized.

4 Claims, 4 Drawing Sheets

(a)

(b)

(a)

(b)

(a)

(b)

PHOTOCATHODE

BACKGROUND OF THE INVENTION

1. Field of the Invention

The present invention relates to a photocathode.

2. Related Background Art

As a conventional photocathode, known is one including a substrate, a photon absorbing layer (light absorbing layer) formed on the substrate, an electron emitting layer formed on the photon absorbing layer, and a mesh-like grid formed on the electron emitting layer, as described in, for example, Patent Document 1 (Japanese Patent Publication No. 2668285). A very small part of the surface of the electron emitting layer is covered with the grid.

Patent Document 1: Japanese Patent Publication No. 2668285

SUMMARY OF THE INVENTION

When to-be-detected light is made incident into the photocathode described in Patent Document 1 from the substrate side, the to-be-detected light is transmitted through the substrate and reaches the photon absorbing layer, and is absorbed by the photon absorbing layer. However, when the thickness of the photon absorbing layer is reduced in order to improve time resolution, the to-be-detected light can be transmitted through the photon absorbing layer without being sufficiently absorbed in the photon absorbing layer. The to-be-detected light that has been transmitted through the photon absorbing layer without being sufficiently absorbed therein reaches the electron emitting layer. In the photocathode described in Patent Document 1, most of the surface of the electron emitting layer is exposed from the grid meshes. Therefore, most of the to-be-detected light that has reached the electron emitting layer is emitted to the exterior through the grid meshes.

Thus, in the photocathode described in Patent Document 1, there has been a problem that the to-be-detected light may be emitted to the exterior without being sufficiently absorbed in the photon absorbing layer, so that light detection sensitivity is lowered.

It is therefore an object of the present invention to provide a photocathode that is excellent in light detection sensitivity.

A photocathode according to the present invention is a photocathode that emits photoelectrons in response to incidence of to-be-detected light, including: a first conductivity type support substrate; a first conductivity type light absorbing layer formed on the support substrate; a first conductivity type electron emitting layer formed on the light absorbing layer; a second conductivity type contact layer formed on the electron emitting layer and having a plurality of through-holes; a surface electrode formed on the contact layer; an active layer formed so as to cover a surface of the electron emitting layer exposed from the through-holes of the contact layer, for lowering a work function of the electron emitting layer; and a rear surface electrode provided for the support substrate, wherein a width of the through-hole in a direction of polarization of the to-be-detected light is shorter than a wavelength of the to-be-detected light.

In the photocathode of the present invention, the conductivity type is different between the electron emitting layer and the contact layer. Therefore, a p-n junction type photocathode can be obtained. On the surface of the electron emitting layer exposed from the through-holes, formed is the active layer. Therefore, photoelectrons produced in the light absorbing layer due to absorption of the to-be-detected light can be easily externally emitted from the through-holes.

The to-be-detected light that has not been absorbed by the light absorbing layer is transmitted through the light absorbing layer and reaches the electron emitting layer. The contact layer formed on the electron emitting layer has a plurality of through-holes, and the width of each of the through-holes is shorter than the wavelength of the to-be-detected light in the direction of polarization of the to-be-detected light. Therefore, the to-be-detected light can be suppressed from passing through the through-holes and being emitted to the exterior. The to-be-detected light suppressed from being externally emitted is reflected by the surface of the electron emitting layer thus exposed, and is again made incident into the light absorbing layer to be absorbed.

Thus, according to the present invention, not only can the to-be-detected light be suppressed from being externally emitted from the through-holes, but the light absorption efficiency of the to-be-detected light in the light absorbing layer can also be improved. Furthermore, the produced photoelectrons can also be emitted to the exterior from the through-holes. As a result of these, the photocathode can be made excellent in light detection sensitivity.

Alternatively, a photocathode according to the present invention is a photocathode that emits photoelectrons in response to incidence of to-be-detected light, including: a support substrate; a light absorbing layer formed on the support substrate; an electron emitting layer formed on the light absorbing layer; a surface electrode formed so as to form a Schottky junction with the electron emitting layer and having a plurality of through-holes; an active layer formed so as to cover a surface of the electron emitting layer exposed from the through-holes of the surface electrode, for lowering a work function of the electron emitting layer; and a rear surface electrode provided for the support substrate, wherein a width of the through-hole in a direction of polarization of the to-be-detected light is shorter than a wavelength of the to-be-detected light.

The photocathode of the present invention is a Schottky junction type photocathode, and on the surface of the electron emitting layer exposed from the through-holes of the surface electrode, the active layer is formed. Therefore, photoelectrons produced in the light absorbing layer due to absorption of the to-be-detected light can be easily externally emitted from the through-holes.

The to-be-detected light that has not been absorbed by the light absorbing layer is transmitted through the light absorbing layer and reaches the electron emitting layer. The surface electrode has a plurality of through-holes, and the width of each through-hole is shorter than the wavelength of the to-be-detected light in the direction of polarization of the to-be-detected light. Therefore, the to-be-detected light can be suppressed from passing through the through-holes and being emitted to the exterior. The to-be-detected light suppressed from being externally emitted is reflected by the surface of the electron emitting layer thus exposed, and is again made incident into the light absorbing layer to be absorbed.

Thus, according to the present invention, not only can the to-be-detected light be suppressed from being externally emitted from the through-holes, but the light absorption efficiency of the to-be-detected light in the light absorbing layer can also be improved. Furthermore, the produced photoelectrons can also be emitted to the exterior from the through-holes. Accordingly, the photocathode can be made excellent in light detection sensitivity.

According to the present invention, a photocathode that is excellent in light detection sensitivity can be provided.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Hereinafter, preferred embodiments of a photocathode according to the present invention will be described in detail with reference to the drawings.

Figure 1:
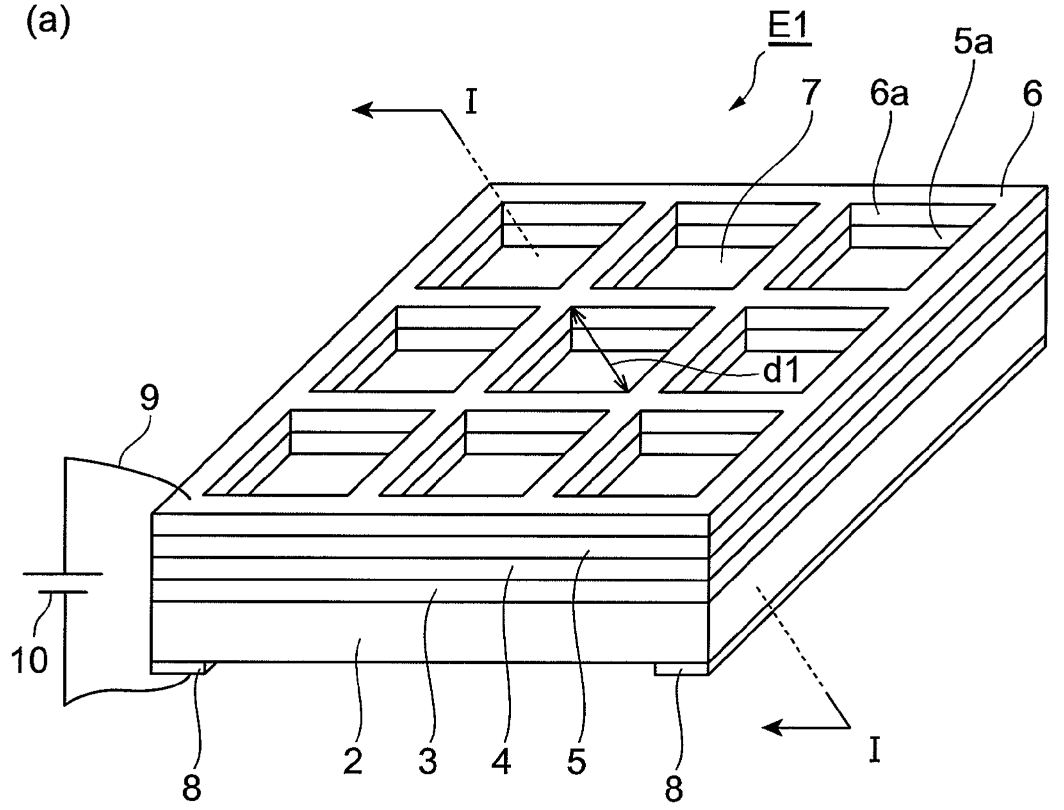
FIG. 1 is a figure including views showing a photocathode according to a first embodiment of the present invention.
Figure 1:
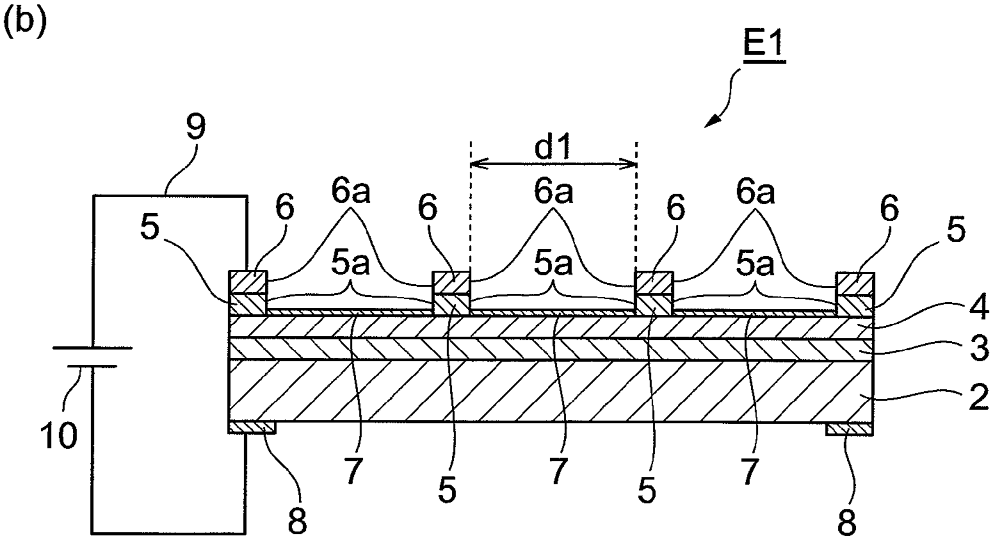

FIG. 1 is a figure including views showing a photocathode according to a first embodiment of the present invention. FIG. 1(*a*) is a perspective view of a photocathode according to the present embodiment, and FIG. 1(*b*) is a sectional view along a line I-I of the photocathode shown in FIG. 1(*a*).

A photocathode E1 according to the present embodiment is a field assist type photocathode, and includes, as shown in FIG. 1, a support substrate 2, a light absorbing layer 3, an electron emitting layer 4, a contact layer 5, a surface electrode 6, an active layer 7, and a rear surface electrode 8.

The support substrate 2 is a first conductivity type substrate formed of a III-V compound semiconductor, and more concretely, a $p^-$ type InP semiconductor substrate. This support substrate 2 has an absorption edge wavelength shorter than the wavelength of irradiation light made incident into the photocathode E1.

On one principal surface of the support substrate 2, formed is the first conductivity type light absorbing layer 3. The light absorbing layer 3 is a layer that absorbs light and produces photoelectrons. The light absorbing layer 3 is made of a $p^-$ type InGaAs semiconductor, and the light absorbing layer 3 has an absorption edge wavelength longer than the wavelength of the irradiation light. On this light absorbing layer 3, formed is the first conductivity type electron emitting layer 4. The electron emitting layer 4 is a layer that accelerates the photoelectrons produced in the light absorbing layer 3. The electron emitting layer 4 is made of a $p^-$ type InP semiconductor, and the electron emitting layer 4 has an absorption edge wavelength shorter than the wavelength of the irradiation light.

On the electron emitting layer 4, provided is the second conductivity type contact layer 5. The contact layer 5 has a plurality of through-holes 5 arranged in a matrix (in the present embodiment, 3 rows and 3 columns) and is formed in a lattice form. Each through-hole 5*a* shows a substantially rectangular shape, and a length d1 (longest width) of a diagonal line thereof is shorter than the wavelength of to-be-detected light. The contact layer 5 is formed of an $n^+$ type InP semiconductor, and has a conductivity type different from that of the electron emitting layer 4 made of a $p^-$ type InP semiconductor. Accordingly, a p-n junction is formed between the contact layer 5 and the electron emitting layer 4. The contact layer 5 has an absorption edge wavelength shorter than the wavelength of the irradiation light.

On the contact layer 5, provided is the surface electrode 6 made of Ti. The surface electrode 6 has a plurality of through-holes 6*a* arranged in a matrix (in the present embodiment, 3 rows and 3 columns) and shows a substantially identical shape to that of the contact layer 5. More specifically, each through-hole 6*a* of the surface electrode 6 is formed at a position corresponding to each through-hole 5*a* of the contact layer 5, and is identical in shape and size to each through-hole 5*a* of the contact layer 5. Also, a through-hole 5*a*, 6*a* of approximately 100 nm can be formed through patterning by a reduced projection method or electron beam exposure method.

From each through-hole 5*a*, 6*a*, the surface of the electron emitting layer 4 is exposed. In a manner covering this exposed surface of the electron emitting layer 4, formed is the active layer 7 made of cesium oxide ($Cs_2O$). The active layer 7 is a layer to lower a work function of the electron emitting layer 4. Providing the active layer 7 allows easily emitting the photoelectrons accelerated in the electron emitting layer 4 to the exterior via the through-holes 5*a*.

On the rear surface of the support substrate 2, that is, the surface opposite to the light absorbing layer 3, formed is the rear surface electrode 8. The rear surface electrode 8 is made of AuZn. The surface electrode 6 and the rear surface electrode 8 are connected to a power supply 10 via wiring 9 formed of contact wires, respectively. This power supply 10 applies, for example, 5V of bias voltage between the surface electrode 6 and the rear surface electrode 8.

In the photocathode E1 having a configuration described above, to-be-detected light is made incident from the rear surface side of the support substrate 2. Since the absorption edge wavelength of the support substrate 2 is shorter than the wavelength of the to-be-detected light, the to-be-detected light is transmitted through the support substrate 2. The to-be-detected light transmitted through the support substrate 2 reaches the light absorbing layer 3. Since the absorption edge wavelength of the light absorbing layer 3 is longer than the wavelength of the to-be-detected light, the to-be-detected light is absorbed in the light absorbing layer 3. The light absorbing layer 3 that has absorbed the to-be-detected light produces photoelectrons. Since the p-n junction has been formed between the electron emitting layer 4 and the contact layer 5, due to an effect of an electric field generated by the bias voltage applied between the surface electrode 6 and the rear surface electrode 8, the photoelectrons produced in the light absorbing layer 3 are accelerated in the electron emitting layer 4 and emitted into a vacuum from the surface of the electron emitting layer 4 lowered in the work function by the active layer 7.

Meanwhile, depending on the thickness and the like of the light absorbing layer 3, the to-be-detected light can be transmitted through the light absorbing layer 3 without being sufficiently absorbed by the light absorbing layer 3. In this case, although the to-be-detected light transmitted through the light absorbing layer 3 reaches the electron emitting layer 4, since the absorption edge wavelength of the electron emitting layer 4 has been set shorter than the wavelength of the to-be-detected light, such to-be-detected light is transmitted through the electron emitting layer 4.

Of the to-be-detected light that is transmitted through the electron emitting layer 4, to-be-detected light that proceeds toward an area covered with the contact layer 5, that is, an area formed with no through-holes 5*a* is made incident into the contact layer 5. The absorption edge wavelength of the contact layer 5 has been set shorter than the wavelength of the to-be-detected light. Therefore, the to-be-detected light made incident into the contact layer 5 is transmitted through the contact layer 5. The to-be-detected light transmitted through the contact layer 5 is reflected by the surface electrode 6 formed on the contact layer 5, and is again made incident into the light absorbing layer 3 via the contact layer 5 and the electron emitting layer 4, and is absorbed.

A part of the to-be-detected light that is transmitted through the electron emitting layer 4 proceeds toward the through-holes 5*a*. Conventionally, it is known that where the length of a through-hole is provided as d and the wavelength of light is provided as λ, transmittance T of the light through the through-hole can be expressed by the following equation (1).

$$T = \left(\frac{d}{\lambda}\right)^4 \tag{1}$$

The length d1 of the diagonal line of each through-hole 5*a* corresponds to d in the equation (1) described above, and the wavelength of the to-be-detected light corresponds to λ in the equation (1) described above. In the photocathode E1 according to the present embodiment, the length d1 of the diagonal line of each through-hole 5*a* is shorter than the wavelength of the to-be-detected light. Therefore, according to equation (1), transmittance of the to-be-detected light through the through-hole 5*a* becomes less than 1, and emission of the to-be-detected light from the through-hole 5*a* can thus be reliably suppressed. For example, when the wavelength of the to-be-detected light is approximately 1000 nm, by providing the length d1 of the diagonal line of each through-hole 5*a* as 500 nm, transmittance of the to-be-detected light through the through-hole 5*a* becomes less than 10%, so that the amount of the to-be-detected light to be emitted from the through-hole 5*a* can be made considerably small.

The to-be-detected light suppressed from being emitted from the through-hole 5*a* is reflected by the exposed surface of the electron emitting layer 4. The reflected to-be-detected light is again made incident into the light absorbing layer 3 via the electron emitting layer 4 and is absorbed.

As described above, by making the length d1 of the diagonal line of the through-hole 5*a* shorter than the wavelength of the to-be-detected light, not only can the to-be-detected light be suppressed from leaking from the through-hole 5*a*, but it also becomes possible to reflect the to-be-detected light by the surface electrode 6 and again make the same incident into the light absorbing layer 3. Accordingly, light absorption efficiency of the to-be-detected light in the light absorbing layer 3 can be improved without hindering external emission of the photoelectrons. As a result, the photocathode E1 can be made excellent in light detection sensitivity.

Here, the reason for making the length d1 of the diagonal line of the through-hole 5*a* shorter than the wavelength of the to-be-detected light will be described in greater detail.

More precisely, d of equation (1) indicates the length of the through-hole in the direction of an electric field vector of the to-be-detected light. Therefore, for lowering the transmittance T of the to-be-detected light through the through-hole, it is necessary to make the length of the through-hole in the direction of an electric field vector of the to-be-detected light shorter than the wavelength of the to-be-detected light.

Now, consideration is given to a case where the length of a short side of the through-hole 5*a* is shorter than the wavelength of to-be-detected light and the length of a long side is longer than the wavelength of the to-be-detected light, for example. In this case, if the direction of polarization (direction of an electric field vector) of the to-be-detected light is coincident with the short side direction of the through-hole 5*a,d* of equation (1) expresses the length of the short side of the through-hole 5*a*. Since the short side of the through-hole 5*a* is shorter than the wavelength of the to-be-detected light, (d/λ) becomes less than 1, so that the transmittance of the to-be-detected light through the through-hole 5*a* can be suppressed low. However, when the direction of polarization of the to-be-detected light is coincident with the long side direction of the through-hole 5*a,d* of equation (1) expresses the length of the long side of the through-hole 5*a*. Since the long side of the through-hole 5*a* is longer than the wavelength of the to-be-detected light, (d/λ) becomes more than 1, so that transmittance of the to-be-detected light through the through-hole 5*a* becomes high.

The to-be-detected light is not always a linearly-polarized light and is sometimes a circularly-polarized light. Moreover, even with a linearly-polarized light, it is sometimes difficult to control the direction of polarization. By making the longest dimension of the through-hole 5*a* shorter than the wavelength of the to-be-detected light, regard1ess of the direction in which the electric field vector of the to-be-detected light is oriented, the length of the through-hole 5*a* in the direction of polarization of the to-be-detected light can always be made shorter than the wavelength of the to-be-detected light. The longest dimension of the through-hole 5*a* is the length d1 of the diagonal line. For such a reason, in the present embodiment, the length d1 of the diagonal line of the through-hole 5*a* is set shorter than the wavelength of the to-be-detected light.

However, when the direction of polarization of the to-be-detected light is invariable, it is not necessary to set the length d1 of the diagonal line of the through-hole 5*a* shorter than the wavelength of the to-be-detected light, and it suffices that the width of the through-hole 5*a* in the direction of polarization of the to-be-detected light is shorter than the wavelength of the to-be-detected light. For example, if the direction of polarization of the to-be-detected light is always coincident with the short side direction of the through-hole 5*a*, it suffices that the length of the short side of the through-hole 5*a* is shorter than the wavelength of the to-be-detected light, and the lengths of the long side and the diagonal line can be set arbitrarily.

Figure 2:
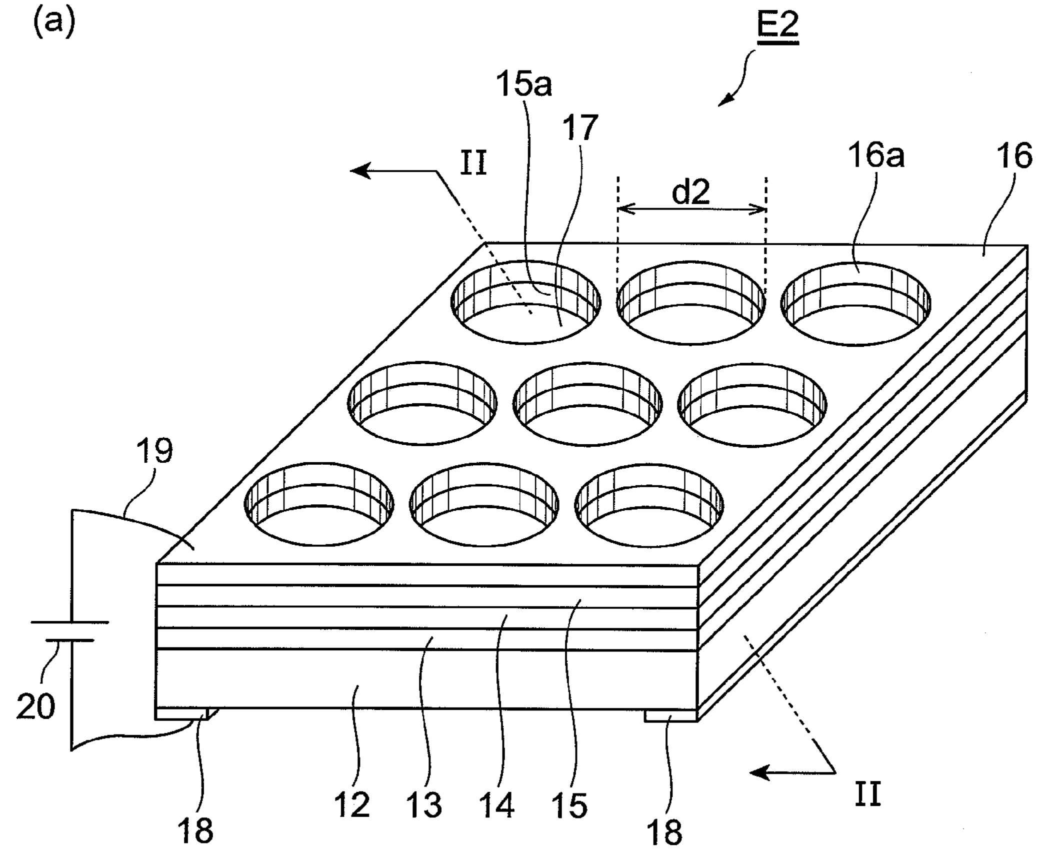
FIG. 2 is a figure including views showing a photocathode according to a second embodiment of the present invention.
Figure 2:
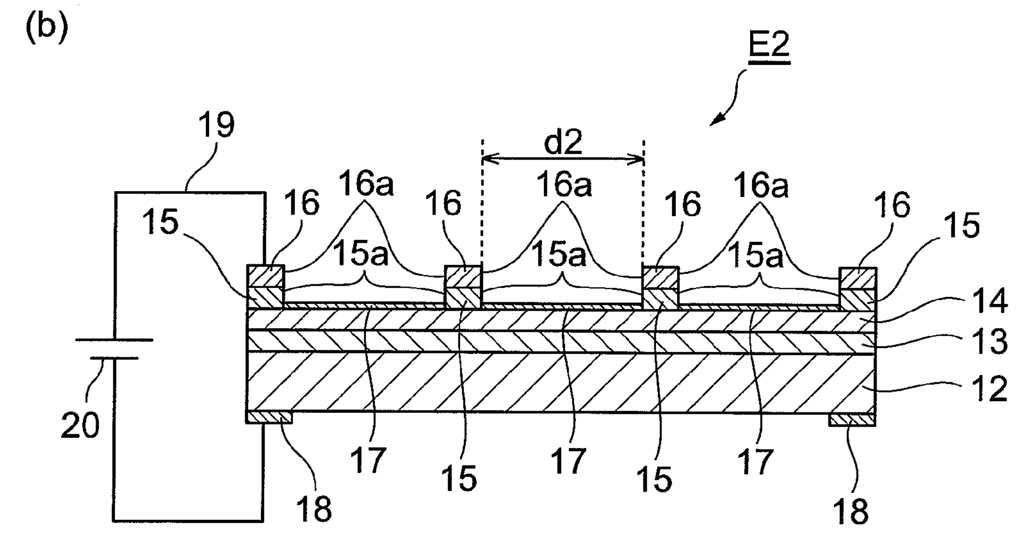

FIG. 2 is a figure including views showing a photocathode according to a second embodiment of the present invention. FIG. 2(*a*) is a perspective view of a photocathode according to the present embodiment, and FIG. 2(*b*) is a sectional view along a line II-II of the photocathode shown in FIG. 2(*a*).

In a photocathode E2 according to the present embodiment, the shape of through-holes 15*a* and 16*a* of a contact layer 15 and a surface electrode 16 is different from the shape of the through-holes 5*a* and 6*a* of the contact layer 5 and the surface electrode 6 in the photocathode E1 of the foregoing embodiment. A support substrate 12, a light absorbing layer 13, an electron emitting layer 14, an active layer 17, and a rear surface electrode 18 are the same as the support substrate 2, the light absorbing layer 3, the electron emitting layer 4, the active layer 7, and the rear surface electrode 8 in the photocathode E1.

The contact layer 15 formed on the electron emitting layer 14 has a plurality of through-holes 15*a* arranged in a matrix (in the present embodiment, 3 rows and 3 columns). The through-holes 15*a* are in circular shapes, and a diameter (longest width) d2 thereof is shorter than the wavelength of to-be-detected light made incident into the photocathode E2. The surface electrode 16 formed on the contact layer 15 has a plurality of through-holes 16*a*. Each through-hole 16*a* is formed at a position corresponding to each through-hole 15*a* of the contact layer 15, and is identical in shape and size to each through-hole 15*a* of the contact layer 15. Also, the through-holes 15*a* may be arranged so that adjacent columns become a zigzag alignment with one another.

When to-be-detected light is made incident, into the photocathode E2 having such a configuration, from the rear surface side of the support substrate 12, the same effects as those of the photocathode E1 can be obtained.

More specifically, the to-be-detected light that has not been sufficiently absorbed in the light absorbing layer 13 is transmitted through the light absorbing layer 13 and reaches the electron emitting layer 14. Of the to-be-detected light that has reached the electron emitting layer 14, to-be-detected light that proceeds toward an area covered with the contact layer 15, that is, an area formed with no through-holes 15*a* is made incident into the contact layer 15, and is reflected by the surface electrode 16 formed on the contact layer 15. The to-be-detected light reflected by the surface electrode 16 is again made incident into the light absorbing layer 13 to be absorbed. Although a part of the to-be-detected light that has reached the electron emitting layer 14 proceeds toward the through-holes 15*a*, since the diameter d2 of each through-hole 15*a* is shorter than the wavelength of the to-be-detected light, emission of the to-be-detected light through the through-holes 15*a* is suppressed. The to-be-detected light suppressed from being emitted from the through-holes 15*a* is reflected by the exposed surface of the electron emitting layer 14, and is again made incident into the light absorbing layer 13 to be absorbed.

As has been described above, even when the through-holes 15*a* are formed in circular shapes, by making the diameter d2 of each through-hole 15*a* shorter than the wavelength of the to-be-detected light, not only can the to-be-detected light be suppressed from leaking from the through-hole 15*a*, but it also becomes possible to reflect the to-be-detected light by the exposed surface of the electron emitting layer 14 and again make the same incident into the light absorbing layer 13.

Figure 3:
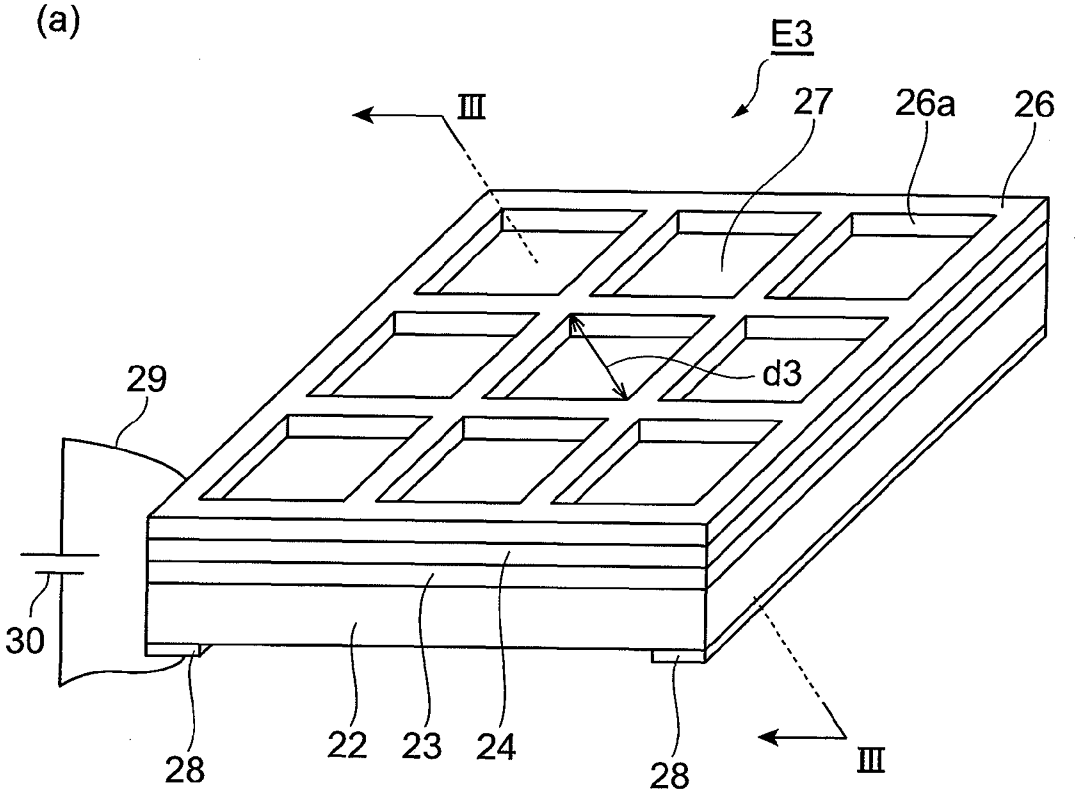
FIG. 3 is a figure including views showing a photocathode according to a third embodiment of the present invention.
Figure 3:
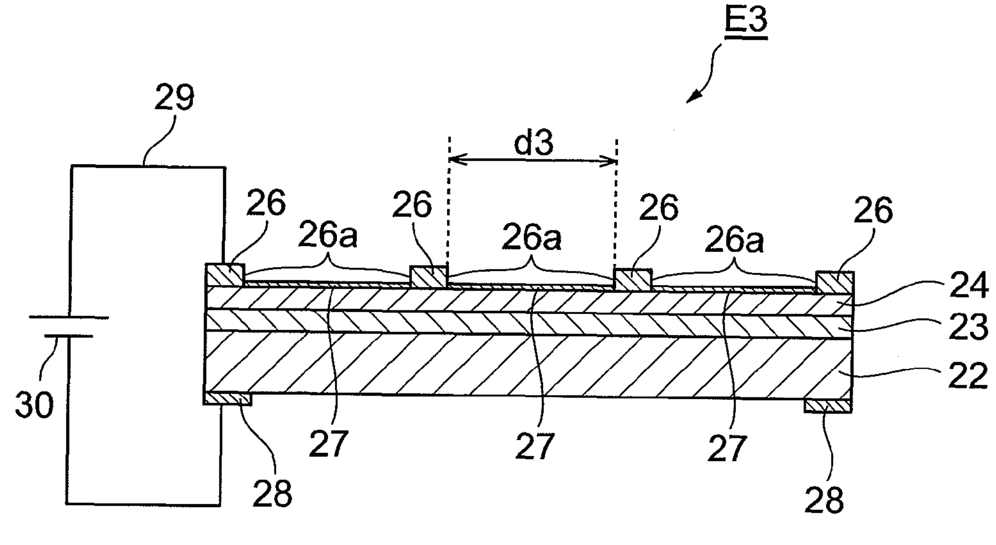

FIG. 3 is a figure including views showing a photocathode according to a third embodiment of the present invention. FIG. 3(*a*) is a perspective view of a photocathode according to the present embodiment, and FIG. 3(*b*) is a sectional view along a line III-III of the photocathode shown in FIG. 3(*a*).

A photocathode E3 of the present embodiment is different from the photocathode E1 of the foregoing embodiment in the point of making a surface electrode 26 contact an electron emitting layer 24 without including a contact layer and the point that the surface electrode 26 is made of Al. The photocathode E3 is a photocathode formed by making the surface electrode 26 form a Schottky junction with the electron emitting layer 24. A support substrate 22, a light absorbing layer 23, an electron emitting layer 24, an active layer 27, and a rear surface electrode 28 are the same as the support substrate 2, the light absorbing layer 3, the electron emitting layer 4, the active layer 7, and the rear surface electrode 8 in the photocathode E1.

When to-be-detected light is made incident, into the photocathode E3 having such a configuration, from the rear surface side of the support substrate 22, as well, the same effects as those when to-be-detected light is made incident into the photocathode E1 can be obtained. More specifically, with regard to through-holes 26*a* of the surface electrode 26, by making a length d3 of a diagonal line thereof shorter than the wavelength of to-be-detected light, not only can the to-be-detected light be suppressed from being emitted through the through-hole 26*a*, but it also becomes possible to reflect the to-be-detected light by the exposed surface of the electron emitting layer 24 and again make the same incident into the light absorbing layer 23. Moreover, since the Schottky junction has been formed between the electron emitting layer 24 and the surface electrode 26, due to an effect of an electric field generated by the bias voltage applied between the surface electrode 26 and the rear surface electrode 28, the photoelectrons produced in the light absorbing layer 23 can be accelerated in the electron emitting layer 24. As a result, it becomes possible to emit the photoelectrons into a vacuum from the surface of the electron emitting layer 24 lowered in the work function by the active layer 27.

The present invention is not limited to the abovementioned embodiments, and various modifications can be made.

For example, in the above-described embodiments, although it has been provided that the support substrate 2, 12, 22 and the electron emitting layer 4, 14, 24 are formed of $p^-$ type InP semiconductors, and the light absorbing layer 3, 13, 23 is formed of a $p^-$ type InGaAs semiconductor, and the contact layer 5, 15 is formed of an $n^+$ type InP semiconductor, these may be formed of other semiconductor materials, respectively. However, the absorption edge wavelength of the light absorbing layer must be longer than the wavelength of to-be-detected light, and the absorption edge wavelengths of the support substrate, the electron emitting layer, and the contact layer must be shorter than the wavelength of to-be-detected light.

In the above-described embodiments, although it has been provided that the surface electrode 6, 16 of the p-n junction type photocathode E1, E2 is made of Ti and the surface electrode 26 of the Schottky junction type photocathode E3 is made of Al, the materials are not limited thereto, and the surface electrodes may be made of other materials. In the case of a p-n junction type photocathode, it suffices with a material whereby a satisfactory electrical connection can be obtained with the contact layer, and in the case of a Schottky junction type photocathode, it suffices with a material whereby a satisfactory electrical connection can be obtained with the electron emitting layer.

Moreover, in the above-described embodiments, although it has been provided that the rear surface electrode 8, 18, 28 is made of AuZn, the material is not limited thereto, and it suffices with a material whereby a satisfactory electrical connection can be obtained with the support substrate. Moreover, although it has been provided that the active layer 7, 17, and 27 is made of $Cs_2O$, it suffices that this is made of an electronic material said to lower the work function, and this may be formed of other alkali oxides such as, for example, KCsO.

Moreover, although it has been provided that the through-holes 6*a*, 16*a* of the surface electrode 6, 16 are identical in size to the through-holes 5*a*, 15*a* of the contact layer 5, 15, these may be different. Moreover, the shape and alignment of the through-holes of the contact layer 5, 15 and the surface electrode 26 are not limited to ones in the embodiments described above, and it suffices that the maximum width of each through-hole is shorter than the wavelength of to-be-detected light.

Figure 4:
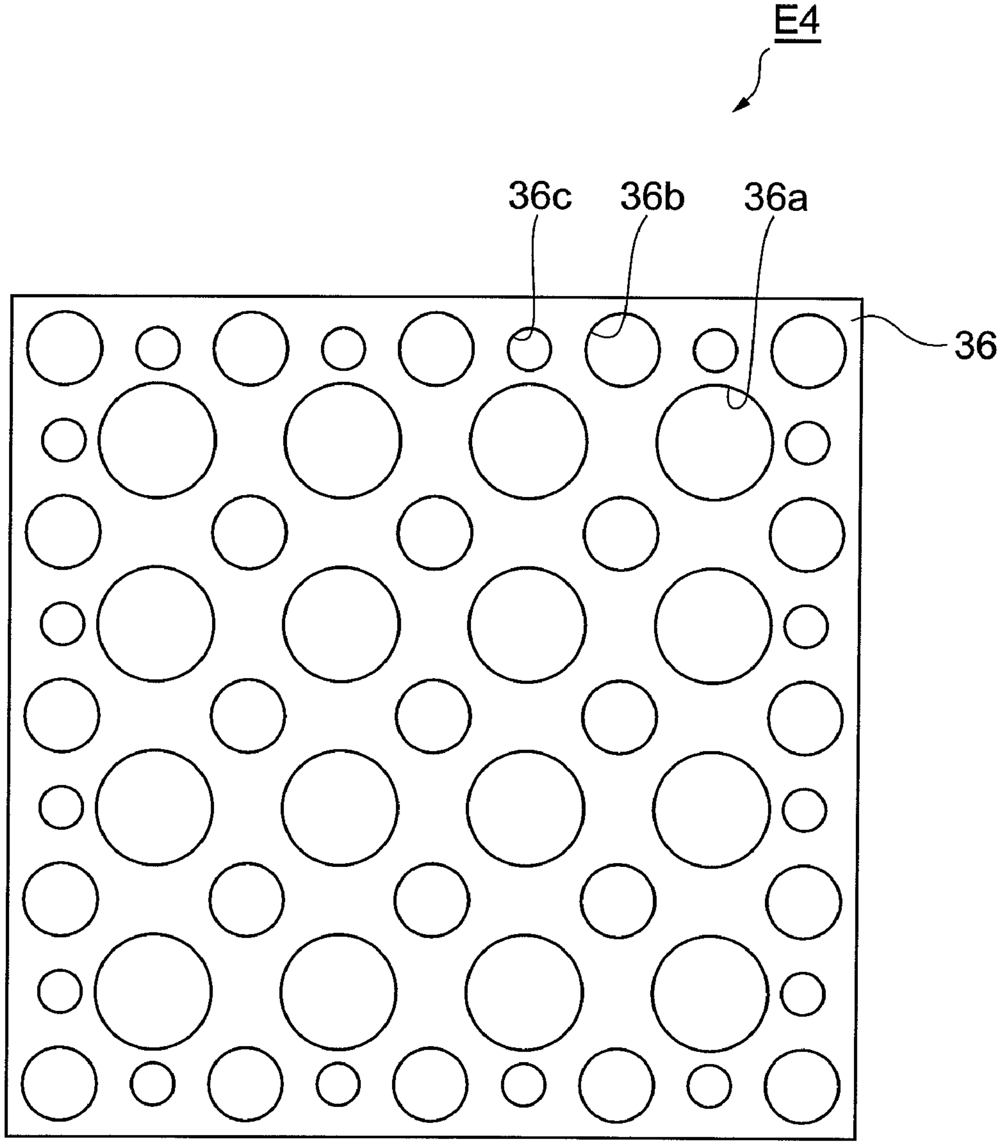
FIG. 4 is a view showing a modification example of through-holes possessed by the surface electrode of a photocathode.

FIG. 4 shows a modification example thereof. A layer 36 of a photocathode E4 shown in FIG. 4 has three sizes of through-holes 36*a*, 36*b*, and 36*c* in a plurality, respectively. The layer 36 corresponds to a contact layer when the photocathode E4 is a p-n junction type, and corresponds to a surface electrode when the photocathode E4 is a Schottky junction type. In the layer 36, arranged between the through-holes 36*a* having the largest diameter is the through-hole 36*b* having the second largest diameter, and arranged between the through-holes 36*b* is the through-hole 36*c* having the smallest diameter.

Since thus forming a larger number of through-holes allows increasing an area to emit photoelectrons, it becomes possible to efficiently emit photoelectrons. As a result, a photocathode higher in detection sensitivity can be obtained. As a matter of course, the diameters of the through-holes 36*a,* 36*b,* and 36*c* are shorter than the wavelength of to-be-detected light, respectively.

Here, in the photocathode according to the above-described embodiment, used is a photocathode that emits photoelectrons in response to incidence of to-be-detected light, including: a first conductivity type support substrate; a first conductivity type light absorbing layer formed on the support substrate; a first conductivity type electron emitting layer formed on the light absorbing layer; a second conductivity type contact layer formed on the electron emitting layer and having a plurality of through-holes; a surface electrode formed on the contact layer; an active layer formed so as to cover the surface of the electron emitting layer exposed from the through-holes of the contact layer, for lowering the work function of the electron emitting layer, and a rear surface electrode provided on the support substrate, wherein the width of the through-hole in the direction of polarization of the to-be-detected light is shorter than the wavelength of the to-be-detected light.

Alternatively, in the photocathode according to the above-described embodiment, used is a photocathode that emits photoelectrons in response to incidence of to-be-detected light, including: a support substrate; a light absorbing layer formed on the support substrate; an electron emitting layer formed on the light absorbing layer; a surface electrode formed so as to form a Schottky junction with the electron emitting layer and having a plurality of through-holes; an active layer formed so as to cover the surface of the electron emitting layer exposed from the through-holes of the surface electrode, for lowering a work function of the electron emitting layer; and a rear surface electrode provided on the support substrate, wherein the width of the through-hole in the direction of polarization of the to-be-detected light is shorter than the wavelength of the to-be-detected light.

Moreover, in the photocathode having the above-described configuration, it is preferable that the longest width of the through-hole is shorter than the wavelength of the to-be-detected light. In this case, regardless of the direction of polarization of the to-be-detected light, the to-be-detected light can be reliably suppressed from passing through the through-hole. Therefore, a photocathode excellent in light detection sensitivity can be more reliably obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A photocathode that emits photoelectrons in response to incidence of to-be-detected light, comprising:
- a first conductivity type support substrate;
- a first conductivity type light absorbing layer formed on the support substrate;
- a first conductivity type electron emitting layer formed on the light absorbing layer;
- a second conductivity type contact layer formed on the electron emitting layer and having a plurality of through-holes;
- a surface electrode formed on the contact layer;
- an active layer formed so as to cover a surface of the electron emitting layer exposed from the through-holes of the contact layer, for lowering a work function of the electron emitting layer; and
- a rear surface electrode provided for the support substrate, wherein
- a width of the through-hole in a direction of polarization of the to-be-detected light is shorter than a wavelength of the to-be-detected light.

2. The photocathode according to claim 1, wherein a longest width of the through-hole is shorter than the wavelength of the to-be-detected light.

3. A photocathode that emits photoelectrons in response to incidence of to-be-detected light, comprising:
- a support substrate;
- a light absorbing layer formed on the support substrate;
- an electron emitting layer formed on the light absorbing layer;
- a surface electrode formed so as to form a Schottky junction with the electron emitting layer and having a plurality of through-holes;
- an active layer formed so as to cover a surface of the electron emitting layer exposed from the through-holes of the surface electrode, for lowering a work function of the electron emitting layer; and
- a rear surface electrode provided for the support substrate, wherein
- a width of the through-hole in a direction of polarization of the to-be-detected light is shorter than a wavelength of the to-be-detected light.

4. The photocathode according to claim 3, wherein a longest width of the through-hole is shorter than the wavelength of the to-be-detected light.

* * * * *